(12) United States Patent
Craft et al.

(10) Patent No.: US 9,855,566 B1
(45) Date of Patent: Jan. 2, 2018

(54) FLUID EJECTION HEAD AND PROCESS FOR MAKING A FLUID EJECTION HEAD STRUCTURE

(71) Applicant: Funai Electric Co., Ltd., Osaka (JP)

(72) Inventors: Christopher A. Craft, Lexington, KY (US); David L. Bernard, Lexington, KY (US); Andrew L. McNees, Lexington, KY (US); Sean T. Weaver, Lexington, KY (US)

(73) Assignee: Funai Electric Co., Ltd. (JP)

( * ) Notice: Subject to any disclaimer, the term of this patent is extended or adjusted under 35 U.S.C. 154(b) by 0 days.

(21) Appl. No.: 15/295,335

(22) Filed: Oct. 17, 2016

(51) Int. Cl.
| | | |
|---|---|---|
| B05B 1/02 | (2006.01) | |
| B41J 2/14 | (2006.01) | |
| H01L 41/25 | (2013.01) | |
| H01L 41/312 | (2013.01) | |
| H01L 41/332 | (2013.01) | |
| H01L 41/053 | (2006.01) | |

(52) U.S. Cl.
CPC ............... *B05B 1/02* (2013.01); *B41J 2/1433* (2013.01); *H01L 41/0533* (2013.01); *H01L 41/25* (2013.01); *H01L 41/312* (2013.01); *H01L 41/332* (2013.01)

(58) Field of Classification Search
CPC ...... B05B 1/02; B41J 2/1433; H01L 41/0533; H01L 41/312; H01L 41/332; H01L 41/25
See application file for complete search history.

(56) References Cited

U.S. PATENT DOCUMENTS

| 6,409,312 | B1 | 6/2002 | Mrvos et al. | |
|---|---|---|---|---|
| 7,169,538 | B2 | 1/2007 | Bertelsen et al. | |
| 7,479,203 | B2 | 1/2009 | Bernard et al. | |
| 8,173,030 | B2 | 5/2012 | Lebens et al. | |
| 2006/0001698 | A1* | 1/2006 | Hart .................. | B41J 2/1433 347/40 |
| 2006/0017785 | A1 | 1/2006 | Park et al. | |
| 2006/0044347 | A1 | 3/2006 | Kwon et al. | |
| 2008/0292986 | A1* | 11/2008 | Park .................. | B41J 2/1603 430/270.1 |
| 2009/0085972 | A1* | 4/2009 | Sim .................. | B41J 2/1606 347/47 |

* cited by examiner

*Primary Examiner* — Alessandro Amari
*Assistant Examiner* — Roger W Pisha, II
(74) *Attorney, Agent, or Firm* — Luedeka Neely Group, PC

(57) ABSTRACT

A fluid ejection head and a method of making a fluid ejection head. The method includes providing a semiconductor substrate containing a plurality fluid ejection actuators on a device surface thereof. The substrate is reactive ion etched to form one or more fluid supply vias therein. A flow feature layer is laminated to the substrate and is exposed to ultra violet (UV) radiation through a photo mask to provide UV exposed areas of the flow feature layer. The flow feature layer is heated to cross-link material in the UV exposed areas. A nozzle plate layer is laminated to the flow feature layer and exposed to UV radiation through a photo mask to provide UV exposed areas for nozzle holes. The nozzle plate layer is cross-linked with heat and the flow feature layer and nozzle plate layer are developed to form the flow features and nozzle holes in the respective layers.

9 Claims, 5 Drawing Sheets

FLUID EJECTION HEAD AND PROCESS FOR MAKING A FLUID EJECTION HEAD STRUCTURE

TECHNICAL FIELD

The disclosure relates to fluid ejection devices, and in particular to improved methods for making fluid ejection head structures.

BACKGROUND AND SUMMARY

Fluid ejection heads are useful for ejecting a variety of fluids including inks, cooling fluids, pharmaceuticals, lubricants and the like. A widely used fluid ejection head is in an ink jet printer. However, fluid ejection heads may also be used in vaporization devices for vapor therapy, E-cigarettes and the like. New techniques are constantly being developed to provide low cost, highly reliable fluid ejection heads for such devices.

The fluid ejection head is a seemingly simple device that has a relatively complicated structure containing electrical circuits, ink passageways and a variety of tiny parts assembled with precision to provide a powerful, yet versatile fluid ejection head. The components of the ejection head must cooperate with each other and be useful for a variety of fluids and fluid formulations. Accordingly, it is important to match the ejection head components to the fluid being ejected. Slight variations in production quality can have a tremendous influence on the product yield and resulting ejection head performance.

The primary components of a fluid ejection head are a semiconductor substrate, a flow feature layer, a nozzle plate layer, and a flexible circuit attached to the substrate. The semiconductor substrate is preferably made of silicon and contains various passivation layers, conductive metal layers, resistive layers, insulative layers and protective layers deposited on a device surface thereof. Fluid ejection actuators formed on a device surface of the substrate may be thermal actuators or piezoelectric actuators. For thermal actuators, individual heater resistors are defined in the resistive layers and each heater resistor corresponds to a nozzle hole in the nozzle plate for heating and ejecting fluid from the ejection head toward a desired substrate or target.

The nozzle plate layer and the flow feature layer may each be made of a photoimageable material. The flow feature layer is typically spin-coated onto the substrate, imaged and developed to provide flow features therein for directing fluid from a fluid via in the substrate to a heater on the substrate. Next, the substrate is etched to form the fluid vias in a dry reactive ion etching (DRIE) process. A dry film photoresist nozzle layer is then laminated to the flow feature layer using heated, pressure rollers. Finally, the nozzle layer is exposed and developed to form the nozzle holes therein.

During the nozzle plate layer lamination process, the nozzle plate layer is bridged across the fluid via in the substrate and the flow features in the flow feature layer. Stresses are introduced from the laminator rollers into the nozzle plate layer as the laminator roll radially compresses the nozzle plate layer, pushing the nozzle plate layer down into unsupported regions of the flow feature layer. The radial compression of the nozzle plate layer causes UV light diffraction during nozzle plate layer imaging, resulting in poor nozzle hole image quality. A second factor contributing to poor nozzle hole image quality is the fact that the heaters on the substrate are constructed of highly reflective material. The highly reflective material causes UV light rays used during nozzle plate imaging to reflect back into the nozzle plate layer photoresist material causing areas of the unexposed nozzle holes to be exposed to small amounts of UV radiation that results in misshapen nozzle holes.

The planarity of the nozzle plate layer is critical to controlling fluid ejection directionality. Nozzle hole diameter variances also may cause drop mass inconsistencies. Accordingly, there continues to be a need for manufacturing processes and techniques which provide improved fluid ejection head components.

In view of the foregoing, embodiments of the disclosure provide improved fluid ejection heads and a method for making fluid ejection heads. The method includes the steps of: providing a semiconductor substrate containing a plurality fluid ejection actuators on a device surface thereof; reactive ion etching of the substrate to form one or more fluid supply vias therein; laminating a flow feature layer to a device surface of the substrate; exposing the flow feature layer to ultra violet (UV) radiation through a photo mask to provide UV exposed areas of the flow feature layer; heating the flow feature layer to cross-link material in the UV exposed areas of the flow feature layer; laminating a nozzle plate layer to the flow feature layer; exposing the nozzle plate layer to UV radiation through a photo mask to provide UV exposed areas for nozzle holes; cross-linking the nozzle plate layer with heat; and developing the flow feature layer and nozzle plate layer to form the flow features and nozzle holes in the respective layers.

In another embodiment, there is provided a fluid ejection head. The fluid ejection head includes a semiconductor substrate containing a plurality fluid ejection actuators on a device surface thereof and one or more fluid supply vias etched therethrough; a first photoresist layer for flow features laminated to the device surface of the semiconductor substrate; and a second photoresist layer for nozzle holes laminated to the first photoresist layer. The second photoresist layer includes (a) hydrophilic photoresist material layer disposed adjacent to the flow feature layer and (b) a hydrophobic photoresist material layer disposed adjacent to (a).

In one embodiment, the flow feature layer provides an anti-reflective coating on the substrate. In another embodiment, the flow feature layer comprises a negative photoresist material with a thickness ranging from about 5 to about 50 µm, such as from about 10 to about 30 µm.

In another embodiment, the nozzle plate layer comprises a negative photoresist material having a thickness ranging from about 5 to about 50 µm, such as from about 10 to about 30 µm.

In some embodiments, the nozzle plate layer includes a combination of (a) hydrophilic photoresist material layer disposed adjacent to the flow feature layer and (b) a hydrophobic photoresist material layer disposed adjacent to (a), wherein layer (a) has a water contact angle ranging from about 60 to less than about 90 degrees, and layer (b) has a water contact angle ranging from about 91 to about 120 degrees.

In some embodiments, the device surface of the substrate is plasma treated for promoting adhesion between the flow feature layer and the device surface of the substrate, and the flow feature layer is plasma treated with oxygen and a forming gas to promote adhesion between the flow feature layer and the nozzle plate layer.

In some embodiments, the fluid ejection head comprises an inkjet printhead.

An advantage of the embodiments described herein is that the first photoresist layer, or flow feature layer, is effective to minimize stresses on the second photoresist layer, or nozzle plate layer, during a lamination process for the second photoresist layer. Another advantage of the disclosed embodiments, is that the first photoresist layer may be used as an anti-reflective layer between the second photoresist layer and highly reflective heater surfaces during an imaging step for the second photoresist layer. Yet another advantage of the disclosed embodiments is that a reactive ion etching process for fluid flow vias in the substrate is conducted before the first photoresist layer is applied to the substrate thereby avoiding flow feature damage during the etching or striping processes, which would enable more aggressive strip processes for higher ejection head yields.

BRIEF DESCRIPTION OF THE DRAWINGS

Further features and advantages of the disclosed embodiments will become apparent by reference to the detailed description when considered in conjunction with the figures, which are not to scale, wherein like reference numbers indicate like elements through the several views, and wherein:

FIGS. 2-5A are schematic views, not to scale, of prior art steps for making a fluid ejection head;

DETAILED DESCRIPTION OF THE EMBODIMENTS

Figure 1A:
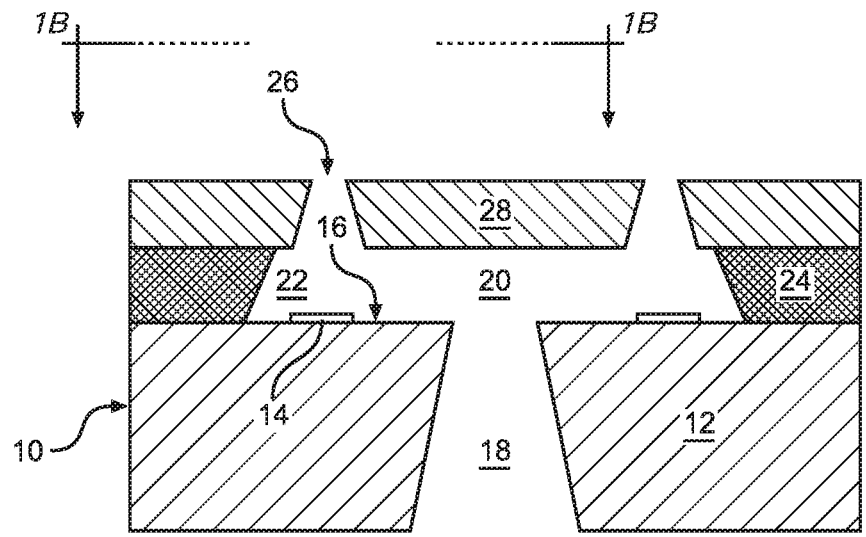
FIG. 1A is a schematic cross-sectional view, not to scale of a portion of a fluid ejection head according to the disclosure.
Figure 1B:
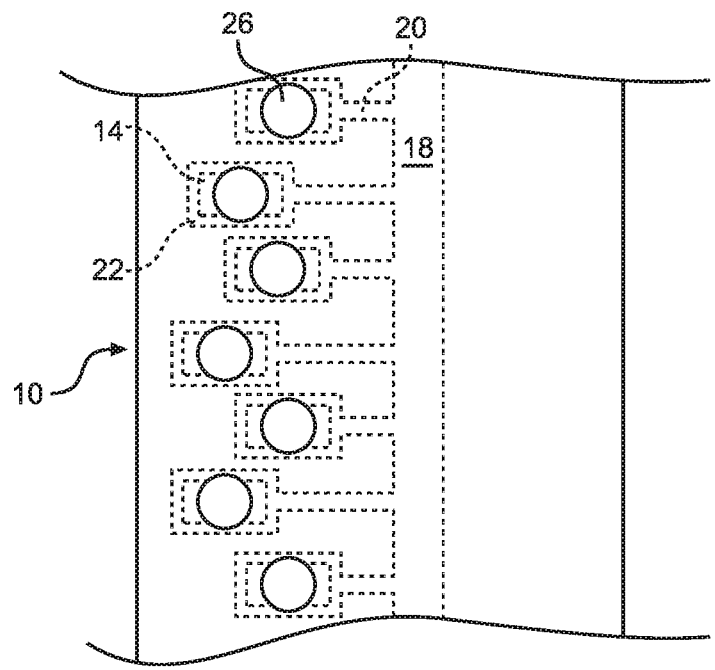
FIG. 1B is a plan schematic view, not to scale, of a portion of a fluid ejection head according to the disclosure.
Figure 2:
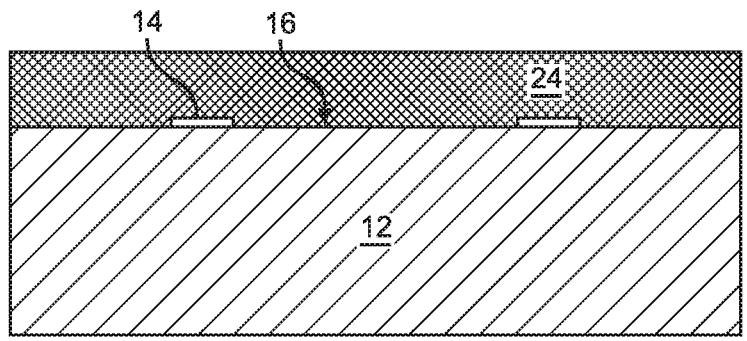
Figure 3:
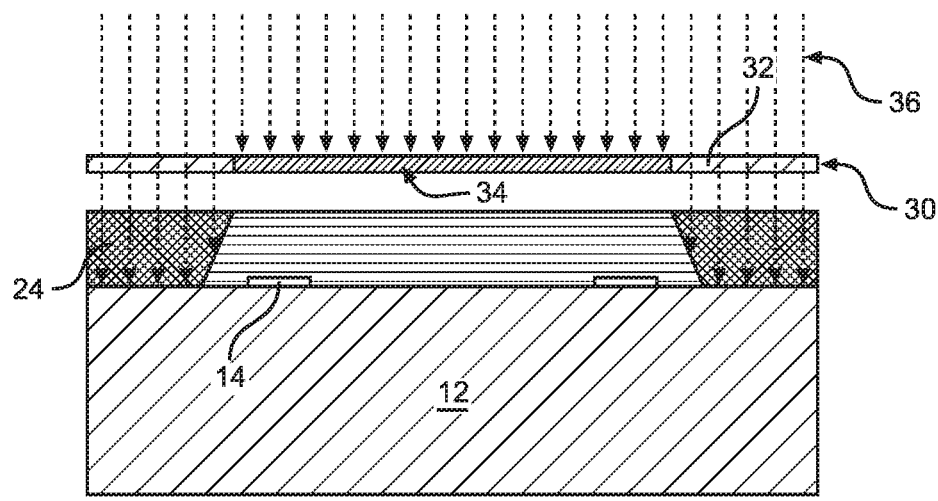

With reference to FIGS. 1A and 1B, there is shown a simplified representation of a portion of a prior art fluid ejection head 10. The ejection head includes a semiconductor substrate 12 that is preferably a silicon semiconductor substrate 12 containing a plurality of fluid ejection actuators such as piezoelectric devices or heater resistors 14 formed on a device side 16 of the substrate 12 as shown in the simplified illustration of FIG. 1A. Upon activation of heater resistors 14, fluid supplied through one or more fluid supply vias 18 in the semiconductor substrate 12 flows through a fluid supply channel 20 to a fluid chamber 22 in a thick film layer 24 where the fluid is caused to be ejected through nozzle holes 26 in a nozzle plate 28. Fluid ejection actuators, such as heater resistors 14, are formed on the device side 16 of the semiconductor substrate 12 by well-known semiconductor manufacturing techniques.

The semiconductor substrate 12 is relatively small in size and typically has overall dimensions ranging from about 2 to about 8 millimeters wide by about 10 to about 20 millimeters long and from about 0.4 to about 0.8 mm thick. In conventional semiconductor substrates 12, the fluid supply slots 18 are grit-blasted in the semiconductor substrates 12. Such slots 18 typically have dimensions of about 9.7 millimeters long and from about 50 to about 400 microns wide. Fluid may be provided to the fluid ejection actuators by a single one of the slots 18 or by a plurality of openings in the substrate 12 made by a dry etch process selected from reactive ion etching (RIE) or deep reactive ion etching (DRIE), inductively coupled plasma etching, and the like.

The fluid supply slot 18 directs fluid from a fluid reservoir to which the ejection head 10 is attached through the fluid supply slot 18 to the device side 16 of the substrate 12 containing heater resistors 14. The device side 16 of the substrate 12 also preferably contains electrical tracing from the heater resistors 14 to contact pads used for connecting the substrate 12 to a flexible circuit or a tape automated bonding (TAB) circuit for supplying electrical impulses from a fluid ejection controller to activate one or more heater resistors 14 on the substrate 12.

A prior art process for making a fluid ejection head is illustrated schematically in FIGS. 2-6. According to the prior art process, the thick film layer 24 is spin-coated onto the device surface 16 of the substrate 12 containing the heater resistors 14. The thick film layer 24 may be formed from a negative photoresist material. The thick film layer 24 may have a thickness ranging from about 10 to about 80 µm or more, such as from about 20 to about 60 µm.

After coating the substrate, the thick film layer 24 is heated to remove solvents from the spin coated material leaving a solid layer of photoresist material on the substrate 12. A mask 30 (FIG. 3) is used to mask off those areas of the thick film layer 24 that are to remain soluble. Accordingly, the mask 30 contains substantially transparent areas 32 and substantially opaque areas 34 for imaging the thick film layer 24. Ultraviolet (UV) radiation 36 is used to image the thick film layer 24 and cross-link the negative photoresist material.

After imaging the thick film layer 24, the substrate 12 and thick film layer 24 are further heated to cross-link the photoresist material in the exposed areas thereof. A developer solvent is then applied to the substrate 12 and thick film layer 24 to remove uncured photoresist material thereby forming the fluid supply channels 20 and fluid chambers 22 therein. A third heating step at a temperature of about 200° C. for about 2 hours may be used to remove any residual photoinitiator that may be in the photoresist material.

Figure 4:
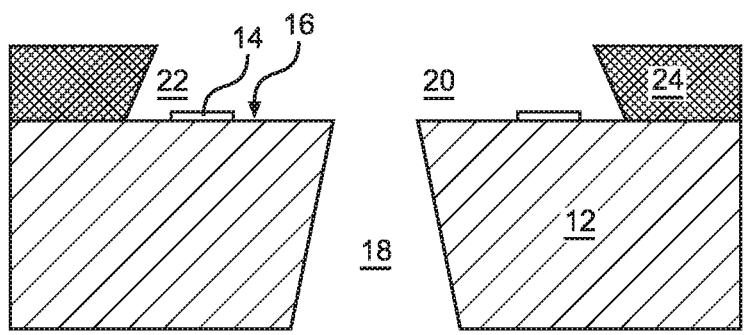

Next, the substrate 12 containing the imaged and developed thick film layer 24 is etched using a deep reactive ion etching (DRIE) process to form the fluid supply vias 18 therein. The DRIB process typically uses a positive photoresist material to mask the substrate 12. The positive photoresist material is removed after etching the substrate 12 using a high pressure solvent strip process. FIG. 4 shows the substrate 12 and thick film layer 24 after etching the via 18 through the substrate 12.

Figure 5A:
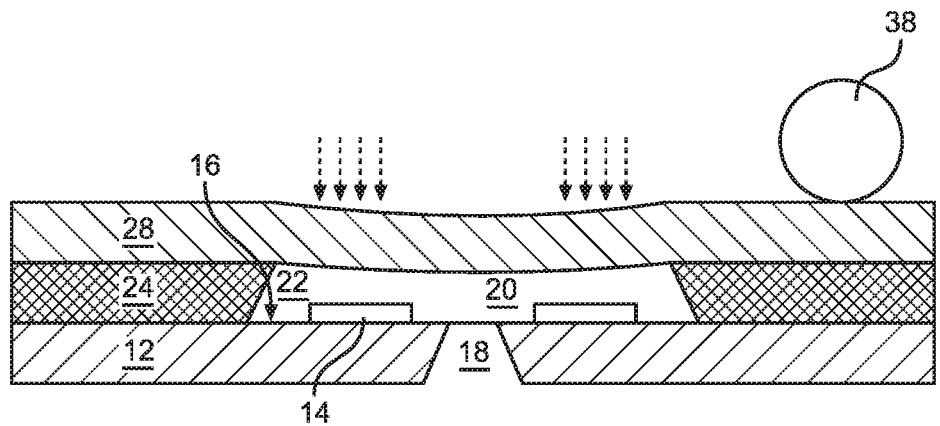
Figure 5B:
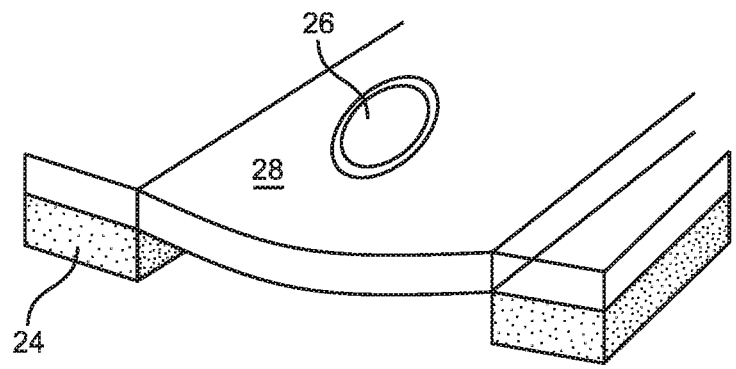
FIG. 5B is a schematic perspective view, not to scale, of a nozzle plate layer resulting from the process shown in FIGS. 2-5A.

In the next step of the process, a dry-film negative photoresist material used to provide the nozzle plate layer 28 is laminated to the thick film layer 24 using a heated roll laminator 38 as shown in FIG. 5A. The nozzle plate layer 28 has a thickness ranging from about 5 to about 50 µm such as from about 10 to about 30 µm. During the lamination process, the nozzle plate layer 28 bridges across the fluid supply via 18 and flow features of the thick film layer 24 and the rolls of the roll laminator 38 compress the nozzle plate layer 28 radially pushing it down into the unsupported via 18, supply channel 20 and fluid chamber 22. The compression of the nozzle plate layer 28 may cause UV light diffraction during the imaging step for the nozzle plate layer 28 thereby causing poor nozzle hole 26 quality as shown in FIG. 5B. A second factor that may contribute to poor nozzle hole 26 image quality is the fact that the heater resistors 14 on the substrate 12 are made of highly reflective metal. The highly reflective metal causes the UV radiation to reflect back into the nozzle plate layer 28, causing areas of the unexposed nozzle hole 26 to be exposed to a small amount of unwanted UV radiation resulting in the misshapen nozzle hole 26 illustrated in FIG. 5B.

The planarity of the nozzle plate layer 28 is critical to controlling fluid ejection directionality. Also nozzle diameter variances may also cause drop mass inconsistencies. Accordingly, an improved process for making a fluid ejection head is provided according to the disclosure.

According to an embodiment of the disclosure, a flow feature layer 40 is used to support a nozzle plate layer and provide an anti-reflective coating over the highly reflective heater resistors 14 on the substrate 12. Such flow feature layer 40 may be a photoresist material having an index of refraction, when measured at the wavelengths of UV radiation used for imaging the nozzle holes, that is lower than an index of refraction of a nozzle plate layer. In another embodiment, the flow feature layer 40 may be selected from material that absorbs UV radiation at the wavelengths used for imaging the nozzle holes in a nozzle plate. In other embodiments, the flow feature layer 40 may be a material that absorbs UV radiation and that has an index of refraction that is lower than the index of refraction of a nozzle plate layer. Such removable and/or patternable flow feature layer 40 may be selected from a negative photoresist materials containing UV absorbent fillers, such as dyes or pigments.

Such dye or pigment filled photoresist layer may be patterned using UV radiation so that it remains in the fluid supply channels 20 and fluid chambers 22 over the heater resistors 14 and/or electrical contacts on the device surface 16 of the substrate 12. During the formation of the nozzle holes, UV radiation used to form the nozzle holes is absorbed by the flow feature layer 40 so that no significant amount of 365 nanometer radiation is reflected off the device surface 16 of the substrate 12 thereby causing irregular nozzle hole formation.

Figure 6:
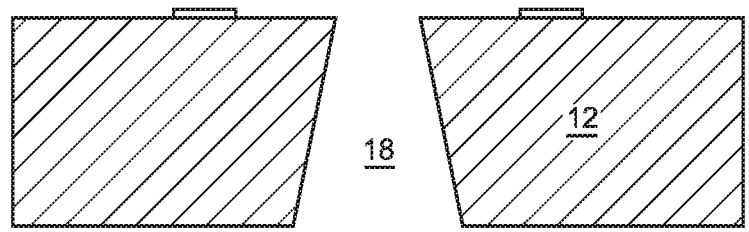
FIGS. 6-10 are schematic views, not to scale, of steps for making a fluid ejection head according to the disclosure.
Figure 7:
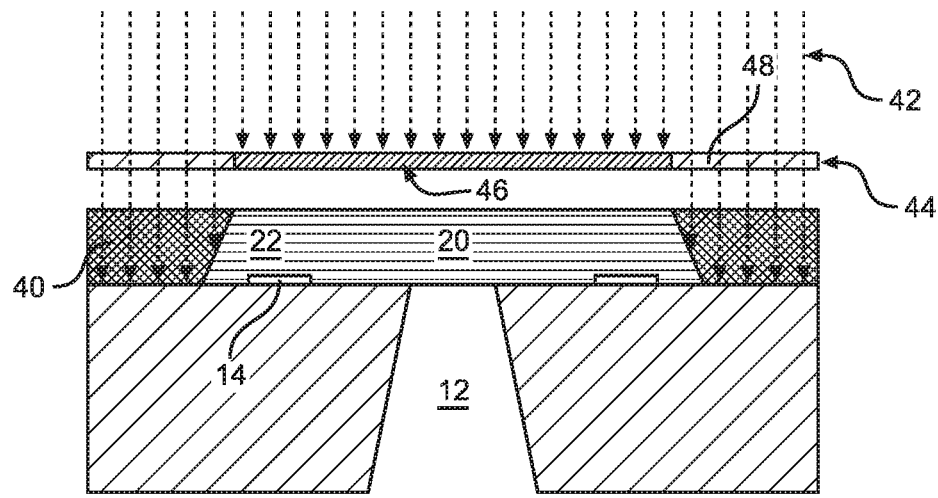

A process for using the flow feature layer 40 to provide support is illustrated in FIGS. 6-10. Prior to depositing a thick film layer and nozzle plate layer on the substrate 12, the substrate 12 is etched using a deep reactive ion etching (DRIE) process to form the fluid supply vias 18 therein. The DRIE process is as described above. The positive photoresist material is removed after etching the substrate 12 using a high pressure solvent strip process. FIG. 6 shows the substrate 12 after etching the via 18 through the substrate 12.

Next a flow feature layer 40 is applied to the substrate 12 by dry laminating the layer 40 onto the device surface of the substrate 12. The device surface of the substrate may be prepared to promote adhesion between the substrate and the flow feature layer 40 by plasma treating the device surface 16 with oxygen and/or silane before laminating the flow feature layer 40 to the substrate 12. Silane compounds that are compatible with the components of the photoresist formulation typically have a functional group capable of reacting with at least one member selected from the group consisting of a multifunctional epoxy compound, a difunctional epoxy compound and a photoinitiator. Such an adhesion enhancing agent may be a silane with an epoxide functional group such as a glycidoxy-alkyltrialkoxysilane, e.g., gamma-glycidoxypropyltrimethoxysilane. When used, the adhesion enhancing agent is preferably present in an amount ranging from about 0.5 to about 2 weight percent and preferably from about 1.0 to about 1.5 weight percent based on total weight of the cured resin, including all ranges subsumed therein. Adhesion enhancing agents, as used herein, are defined to mean organic materials soluble in the photoresist composition which assist the film forming and adhesion characteristics of the flow feature layer 40 on the device surface 16 of the substrate 12.

The flow feature layer 40 is then exposed to UV radiation 42 through a mask 44 having an opaque area 46 and a transparent area 48 as described above and as shown in FIG. 7. The thick film layer 40 is heated to cross-link the UV exposed areas of the thick film layer 40 under the transparent areas 48 of the mask 44. However, unlike the prior art process, the thick film layer 40 is not developed at this stage of the process.

Figure 8:
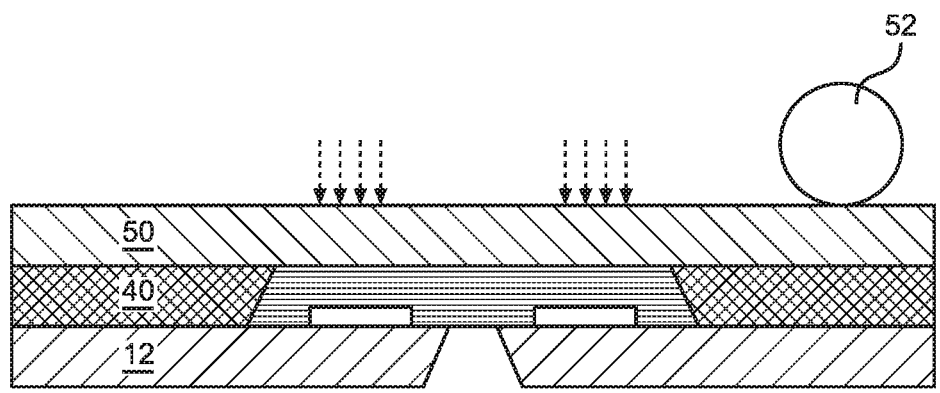

In the next step of the process, as shown in FIG. 8, the nozzle plate layer 50 is laminated to the exposed and undeveloped thick film layer 40 using a compression roll laminator 52. Adhesion may be promoted between the flow feature layer 40 and the nozzle plate layer 50 by treating the flow feature layer 40 with oxygen plasma and a forming gas and/or silane. Since the undeveloped thick film layer 40 provides support for the nozzle plate layer 50, more aggressive temperatures and pressures may be used to laminate the nozzle plate layer 50 to the thick film layer.

Figure 9:
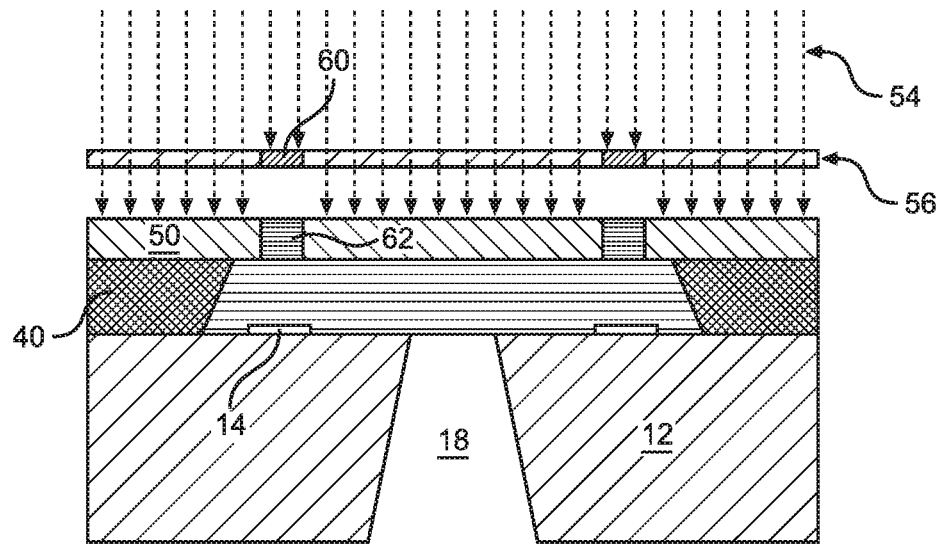
Figure 10:
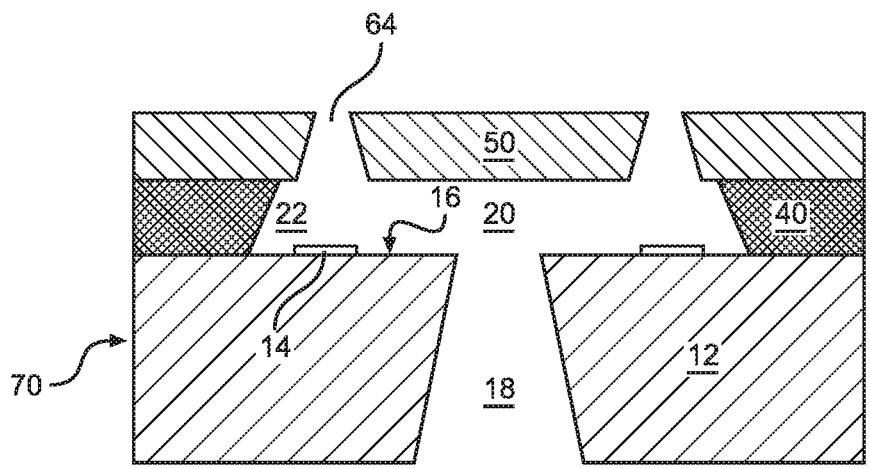

In order to provide nozzle holes in the nozzle plate layer 50, the nozzle plate layer is exposed to UV radiation 54 through a mask 56, having transparent areas 58 and opaque areas 60 corresponding to nozzle hole areas 62 (FIG. 9). After exposing the nozzle plate layer 50 to UV radiation 54, the nozzle plate layer 50 and thick film layer 40 are developed simultaneously using a photoresist developer (FIG. 10). In one embodiment, the substrate 12 containing the exposed layers 40 and 50 is placed in a developer bath using megasonic agitation to dissolve the uncross-linked materials in both the thick film layer 40 and nozzle plate layer 50 so that the uncrosslinked material from the thick film layer 40 is dissolved through the previously formed via 18 and the uncrosslinked material from the nozzle plate 50 is dissolved through nozzle holes 64 in the nozzle plate layer 50. Illustrative developers used in the developer bath include, for example, butyl cellosolve acetate, cyclohexanone, methyl ethyl ketone, a xylene and butyl cellosolve acetate mixture, and $C_{1-6}$ acetates like butyl acetate, or a combination of two or more of the foregoing.

In some embodiments, the nozzle plate layer 50 is a single layer of photoresist material. In other embodiments, the nozzle plate layer 50 includes (a) a first hydrophilic photoresist material layer disposed adjacent to the flow feature layer and (b) a hydrophobic photoresist material layer disposed adjacent to (a). The hydrophilic layer (a) may have a water contact angle ranging from about 60 to about 90 degrees such as from about 80 to about 88 degrees and the hydrophobic layer (b) may have a water contact angle ranging from about 91 to about 120 degrees. A phenoxy resin may be added to layer (b) to increase the hydrophilicity of layer (a). Compounds that may be added to layer (b) to increase the hydrophobicity of layer (b) may include, but are not limited to heptadecafluorodecyltrimethoxysilane, octadecyldimethylchlorosilane, ocatadecyltricholorsilane, and siloxanes.

The nozzle holes 64 typically have an inlet diameter ranging from about 10 to about 50 microns, and an outlet diameter ranging from about 6 to about 40 microns. Due to the size of the nozzle holes 64, even slight variations or imperfections may have a tremendous impact on the performance of the fluid ejection head 70.

A feature of the embodiment of FIGS. 6-10 is improved alignment tolerances between nozzle holes 64 in the nozzle plate layer 50 and the heater resistors 14 since the nozzle holes 64 are formed in the nozzle plate layer 50 after the nozzle plate layer 50 is attached to the flow feature layer 40. Imaging the nozzle holes 64 after attaching a nozzle plate layer 50 to the flow feature layer 40 enables placement of the nozzle holes 64 in the optimum location for each of the heater resistor 14.

Another benefit of the disclosed embodiments is that the DRIE process used to form the fluid supply vias 18 will not harm the flow feature layer 40 since the vias 18 are formed prior to applying the flow feature layer 40 to the substrate 12.

A further benefit of the disclosed embodiments is that more complex processing of fluidic devices may be achieved using thicker flow feature layers than can be achieved with the prior art process.

Finally, the embodiments provide for simpler process steps and a reduction in the number of process steps required to make a fluid ejection head 70.

Having described various aspects and embodiments of the disclosure and several advantages thereof, it will be recognized by those of ordinary skills that the embodiments are susceptible to various modifications, substitutions and revisions within the spirit and scope of the appended claims.

What is claimed is:

1. A fluid ejection head comprising:
    a semiconductor substrate containing a plurality fluid ejection actuators on a device surface thereof and one or more fluid supply vias etched therethrough;
    a first photoresist layer for flow features laminated to the device surface of the semiconductor substrate; and
    a second photoresist layer for nozzle holes laminated to the first photoresist layer, wherein the second photoresist layer comprises (a) hydrophilic photoresist material layer disposed adjacent to the flow feature layer and (b) a hydrophobic photoresist material layer disposed adjacent to (a).

2. The fluid ejection head of claim 1, wherein the first photoresist layer provides an anti-reflective coating on the substrate.

3. The fluid ejection head of claim 1, wherein the first photoresist layer has a thickness ranging from about 10 to about 30 µm.

4. The fluid ejection head of claim 1, wherein the second photoresist layer has a thickness ranging from about 10 to about 30 µm.

5. The fluid ejection head of claim 1, wherein the fluid ejection head comprises an inkjet printhead.

6. The fluid ejection head of claim 1, wherein the first photoresist layer comprises a negative photoresist material.

7. The fluid ejection head of claim 6, wherein the second photoresist layer comprises a negative photoresist material.

8. The fluid ejection head of claim 1, wherein layer (a) has a water contact angle ranging from about 60 to less than about 90 degrees.

9. The fluid ejection head of claim 1, wherein layer (b) has a water contact angle ranging from about 91 to about 120 degrees.

\* \* \* \* \*